(12) United States Patent
Sicard

(10) Patent No.: US 8,030,986 B2
(45) Date of Patent: Oct. 4, 2011

(54) POWER TRANSISTOR WITH TURN OFF CONTROL AND METHOD FOR OPERATING

(75) Inventor: Thierry Sicard, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 74 days.

(21) Appl. No.: 12/549,775

(22) Filed: Aug. 28, 2009

(65) Prior Publication Data

US 2011/0050316 A1  Mar. 3, 2011

(51) Int. Cl.
*H03L 5/00* (2006.01)
*H03K 5/08* (2006.01)

(52) U.S. Cl. ........................................ 327/309

(58) Field of Classification Search ............ 361/152; 327/309
See application file for complete search history.

(56) References Cited

U.S. PATENT DOCUMENTS

| | | | |
|---|---|---|---|
| 5,365,099 A | 11/1994 | Phipps et al. | |
| 5,379,178 A * | 1/1995 | Graf et al. | 361/152 |
| 5,581,432 A | 12/1996 | Wellnitz et al. | |
| 6,078,204 A | 6/2000 | Cooper et al. | |
| 6,169,439 B1 | 1/2001 | Teggatz et al. | |
| 7,015,681 B2 | 3/2006 | Thiery | |
| 2006/0006851 A1 | 1/2006 | Thiery | |
| 2008/0007883 A1 | 1/2008 | Arndt et al. | |
| 2009/0066375 A1 | 3/2009 | Kuroda et al. | |

FOREIGN PATENT DOCUMENTS

EP  0680147 B1  3/1999

OTHER PUBLICATIONS

PCT/US2010/044544 International Search Report and Written Opinion mailed Apr. 22, 2011.

* cited by examiner

*Primary Examiner* — Lincoln Donovan
*Assistant Examiner* — Daniel Rojas
(74) *Attorney, Agent, or Firm* — Joanna G. Chiu

(57) ABSTRACT

A circuit has a power transistor, a driver control circuit, a variable clamp circuit and a turn-off control circuit. The power transistor has a first current electrode coupled to a first power supply terminal, a second current electrode as an output of the circuit, and a control electrode. The driver control circuit has an output coupled to the control electrode of the power transistor for controlling the power transistor during an active mode of the circuit. The variable clamp circuit is coupled between the output of circuit and the first power supply terminal. The turn-off control circuit is coupled to the variable clamp circuit and selects clamping levels of the variable clamp circuit during a transition from the active mode to an inactive mode of the circuit.

20 Claims, 2 Drawing Sheets

POWER TRANSISTOR WITH TURN OFF CONTROL AND METHOD FOR OPERATING

BACKGROUND

1. Field

This disclosure relates generally to power transistors, and more specifically, to power transistors with turn off control.

2. Related Art

Power transistors are used in a variety of applications, such as for the control of Direct Current (DC) motors. Power transistors typically operate at large voltages and draw large currents thus consuming large amounts of energy as compared to other components in the system. Furthermore, when such power transistors are turned off during operation, large peaks in power may occur which may damage other portions of the system. Therefore, a need exists for a power transistor having improved turn off control.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one embodiment, a power transistor is used to drive a DC motor. However, when this power transistor is turned off, large and damaging peak currents may be sustained. Therefore, in one embodiment, a variable clamp is used to control the turn off of the power transistor in order to limit the peak power in the power transistor when switched off. This may be done by clamping the drain to source of the power transistor with increasingly greater clamp voltages at predetermined intervals of time. In doing so, the discharge time of the inductance coil of the DC motor increases. However, by limiting the power and increasing the coil discharge time, the switch off energy capability of the power transistor may be increased.

Figure 1:
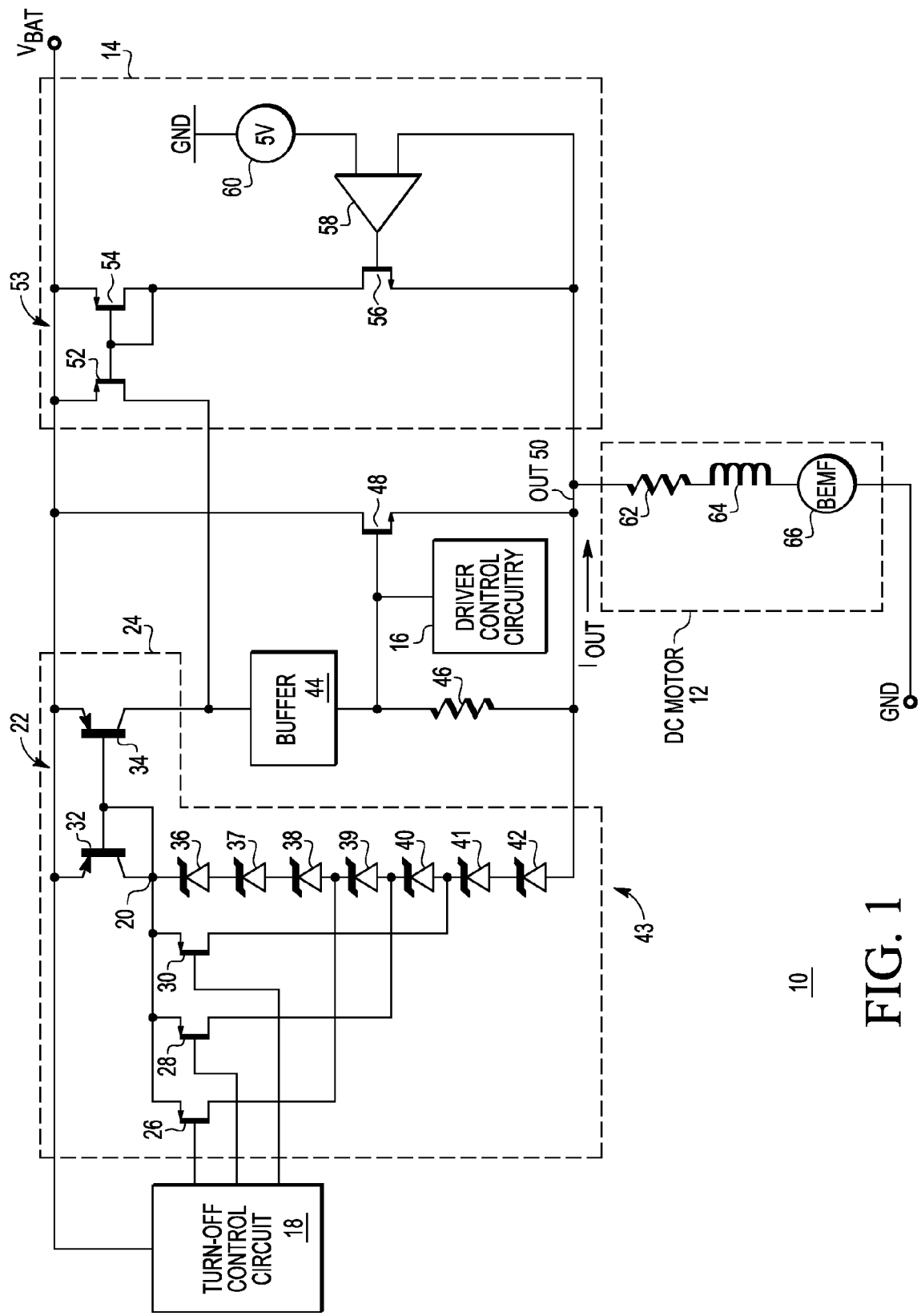
FIG. 1 illustrates in partial schematic and partial block diagram form, a circuit, including a variable clamp circuit, a power transistor, and a DC motor, in accordance with one embodiment of the present invention.

FIG. 1 illustrates in partial block diagram form and partial schematic form, a circuit 10, in accordance with one embodiment of the present invention. Circuit 10 includes a power transistor 48, a variable clamp circuit 24, a turn-off control circuit 18, a buffer 44, a resistive element 46, driver control circuitry 16, a DC motor 12, and a negative voltage clamp 14. A drain of power transistor 48 is coupled to a node Vbat which corresponds to a power supply terminal of circuit 10 which receives the voltage of the battery being applied to circuit 10. A source of power transistor 48 is coupled to an output node 50 (i.e. OUT 50), and a gate of power transistor 48 is coupled to resistive element 46, driver control circuitry 16, variable clamp circuit 24 (via buffer 44), and negative clamp 14. Note that the source and drain of power transistor 48 may also be referred to as current electrodes, and the gate of power transistor 48 may also be referred to as a control electrode. In one embodiment, power transistor 48 is an n-type power transistor (i.e. an N channel power transistor).

The gate of power transistor 48 is also coupled to driver control circuitry 16. A resistive element 46 is coupled between the gate and source of power transistor 48. In one embodiment, resistive element 46 may be included as part of driver control circuitry 16. In one embodiment, resistive element 46 may be implemented as a transistor, such as an n-type transistor (i.e. an N channel transistor), which operates to switch power transistor 48 on and off. For example, during an active mode of circuit 10 in which power transistor 48 is on (as controlled by driver control circuitry 16) and thus driving motor 12, resistive element 46 is basically infinite (e.g. the n-type transistor is off). However, during an inactive mode of circuit 10 in which power transistor 48 is off and no longer driving motor 12, the gate of power transistor 48 is coupled to the source of power transistor 48 via resistive element 46, which, in this inactive mode, represents the intrinsic resistance of the n-type transistor when on and thus coupling the source and drain of power transistor 48 to each other. In alternate embodiments, other switching elements may be used, thus resulting in resistive element 46. Also, resistive element 46 may be referred to as a resistance coupled between the output, OUT 50, and the control electrode of transistor 48.

Variable clamp circuit 24 includes a current mirror 22 coupled to a chain 43 of series-connected zener diodes and to transistors 26, 28, and 30. Current mirror 22 includes a transistor 32 having a first current electrode coupled to Vbat and a second current electrode coupled to a circuit node 20. Current mirror 22 also includes a transistor 34 having a first current electrode coupled to Vbat, a second current electrode coupled to the gate of power transistor 48 via buffer 44, and a control electrode coupled to a control electrode of transistor 32 and to node 20. In one embodiment, the second control electrode of transistor 34 is coupled to an input of buffer 44 and an output of buffer 44 is coupled to the gate of power transistor 48. In one embodiment, each of transistors 32 and 34 are PNP bipolar transistors, and the first current electrodes of transistors 32 and 34 may be referred to as emitters, the second current electrodes as collectors, and the control electrodes as bases. Variable clamp 24 includes chain 43 of series of connected zener diodes 36-42. A cathode of zener diode 36 is coupled to node 20, an anode of zener diode 36 is coupled to a cathode of zener diode 37, an anode of zener diode 37 is coupled to a cathode of zener diode 38, an anode of zener diode 38 is coupled to a cathode of zener diode 39, an anode of zener diode 39 is coupled to a cathode of zener diode 40, an anode of zener diode 40 is coupled to a cathode of zener diode 41, an anode of zener diode 41 is coupled to a cathode of zener diode 42, and a cathode of zener diode 42 is coupled to the source of power transistor 48. Variable clamp circuit 24 also includes transistors 26, 28, and 30. A first current electrode of each of transistors 26, 28, and 30 is coupled to node 20. A second current electrode of transistor 26 is coupled to the anode of zener diode 38, a second current electrode of transistor 28 is coupled to the anode of zener diode 39, and a second current electrode of transistor 30 is coupled to the anode of zener diode 40. In one embodiment, each of transistors 26, 28, and 30 are p-type transistors (i.e. P channel transistors), and the first current electrode of each of transistors 26, 28, and 30 corresponds to the source and the second current electrode of each corresponds to the drain. A control electrode (or gate) of each of transistors 26, 28, and 30 is coupled to turn-off control circuit 18, which is also coupled to Vbat.

Negative clamp circuit 14 includes a current mirror 53, a transistor 56, an amplifier 58 and a voltage source 60. Current mirror 53 includes a transistor 52 having a first current electrode coupled to Vbat and a second current electrode coupled to the gate of power transistor 48. Current mirror 53 also includes a transistor 54 having a first current electrode coupled to Vbat and a control electrode coupled to a control electrode of transistor 52. A second current electrode of transistor 54 is coupled to the control electrode of transistor 54 and to a first current electrode of transistor 56. A second current electrode of transistor 56 is coupled to OUT 50, and a control electrode of transistor 56 is coupled to an output of amplifier 58. Amplifier 58 has a first input coupled to a first terminal of voltage source 60 and a second input coupled to OUT 50. A second terminal of voltage source 60 is coupled to a ground terminal (also referred to as a power supply terminal). In one embodiment, voltage source 60 provides a voltage of 5 volts. In one embodiment, each of transistors 52 and 54 are p-type transistors (i.e. P channel transistors) and transistor 56 is an n-type transistor (i.e. N channel transistor).

DC motor 12 can be any DC motor and is represented by a resistive element 62, an inductive element 64 (also referred to as coil 64 or inductive coil 64), and a voltage source 66 coupled in series between OUT 50 and ground. Voltage source 66 represents the Back Electro Magnetic Force (BEMF) voltage of motor 12.

In operation, circuit 10 may operate in either active mode or inactive mode. During active mode, power transistor 48 is controlled by driver control circuitry 16, as known in the art, to drive motor 12. During active mode, zener diodes 36-42 of chain 43 operate together to prevent OUT 50 from going lower than Vbat minus the voltage provided by chain 43. For example, if each zener diode provides a voltage drop of 5 volts, then chain 43 provides a voltage drop of 35 volts such that OUT 50 is prevented from going lower than "Vbat minus 35V." Also, negative clamp 14 clamps OUT 50 with respect to ground thus preventing OUT 50 from going more negative than the voltage of voltage source 60. That is, negative clamp 14 clamps OUT 50 to a level that is negative in relation to ground. For example, in one embodiment, voltage source 60 provides a voltage of 5V. Therefore, in this example, negative clamp 14, through the comparison between voltage source 60 and OUT 50 (which controls the voltage on the gate of transistor 56), prevents OUT 50 from falling below −5 volts. As illustrated in the embodiment of FIG. 1, negative clamp 14 is also fixed in relation to ground. In one embodiment, as modeled in FIG. 1, DC motor 12 provides a BEMF voltage, as represented by voltage source 66. The BEMF voltage is proportional to the speed of DC motor 12. That is, a higher speed provides a higher BEMF voltage. Therefore, in one embodiment, when power transistor 48 is on and thus driving motor 12, BEMF voltage reaches its maximum value.

During inactive mode, power transistor 48 is switched off such that it no longer drives DC motor 12. In inactive mode, the gate of power transistor 48 is coupled to the source of power transistor 48 via resistive element 46, which, one embodiment, represents the intrinsic resistance of an n-type transistor that is turned on to couple the source of power transistor 48 to the drain of power transistor 48. When transitioning (i.e. switching) power transistor 48 from on to off, turn-off control circuitry 18 controls transistors 26, 28, and 30 to affect the number of zener diodes within chain 43 that operate to clamp the drain to source voltage of power transistor 48. In this manner, turn-off control circuit 18 can select clamping levels of variable clamp circuit 24 during the transition from active to inactive mode by, for example, selectively enabling transistors 26, 28, and 30 to selectively short groups of series-connected zener diodes of chain 43. For example, when transistor 26 is on and transistors 28 and 30 are off, chain 43 includes zener diodes 39-42 where zener diodes 36-38 are shorted. Using the example of each zener diode providing a 5 volt drop, the voltage of the clamp is reduced from 35 volts (when each of transistors 26, 28, and 30 are off) to only 20 volts (since only 4 zener diodes are operating). Therefore, OUT 50 is clamped to Vbat minus 20 volts. Similarly, when transistor 28 is on and transistors 26 and 30 are off, the voltage of the clamp is reduced to 15 volts (in which only zener diodes 40-42 are operating and zener diodes 36-39 are shorted). Therefore, OUT 50 is clamped to Vbat minus 15 volts. Similarly, when transistor 30 is on and transistors 26 and 28 are off, the voltage of the clamp is reduced to 10 volts (in which only zener diodes 41 and 42 are operating and zener diodes 36-40 are shorted). Therefore, OUT 50 is clamped to Vbat minus 10 volts. Therefore, note that each of transistors 26, 28, and 30, when turned on, can short a particular group of zener diodes from chain 43. In this manner, zener diodes of chain 43, or groups of zener diodes of chain 43, can be selectively enabled during the transition from active mode to inactive mode. Also, in the illustrated embodiment, the different clamping levels of variable clamp 24 (e.g. 10V, 15V, and 20V) are fixed in relation to Vbat.

In one embodiment, during the transition from active mode to inactive mode (i.e. when switching power transistor 48 off), each of transistors 30, 28, and 26 are sequentially turned on for a predetermined amount of time such that the clamp value is increased sequentially. Therefore, note that variable clamp circuit 14 can operate to clamp OUT 50 at a plurality of discrete values during a transition from active mode to inactive mode where the discrete values increase in magnitude in relation to Vbat (such as from "Vbat—10 volts", to "Vbat—15 volts", to "Vbat—20 volts") and descend in value in relation to ground. Operation of transistors 26, 28, and 30 are controlled by turn-off control circuit 18, which will be described in more detail in reference to FIG. 2. Also note that during inactive mode, negative clamp 14 continues to operate to prevent OUT 50 from going more negative than the voltage of voltage source 60.

In the illustrated embodiment, buffer 44 is used as an adapter with relatively high impedance at the input and low impedance at the output. In one embodiment, the buffer 44 is present because transistors 34 and 52, without buffer 44, may not provide enough current to generate the appropriate voltage across resistive element 46 during operation.

Figure 2:
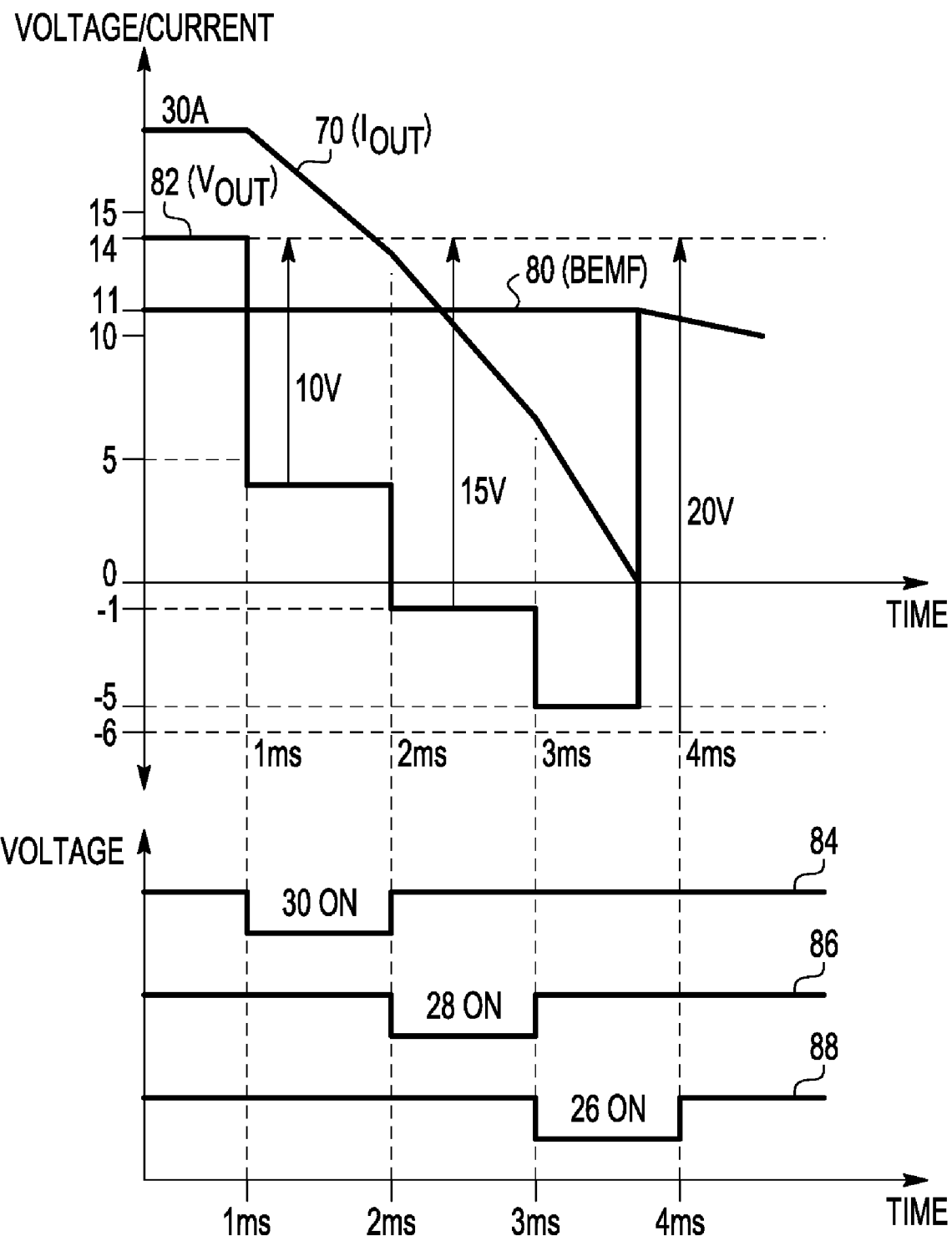
FIG. 2 illustrates a timing diagram for various signals of the circuit of FIG. 1, in accordance with one example of the present invention.

FIG. 2 illustrates a timing diagram with various signals of circuit 10 over time as circuit 10 transitions from active mode to inactive mode. At time=0, circuit 10 is in active mode, in which power transistor 48 is on and driving motor 12. In this example, it is assumed that Vbat is 14 volts. Therefore, curve 82, which represents Vout (the voltage at OUT 50) begins at 14 volts. It is also assumed that the current Iout (illustrated on FIG. 1 as the current at OUT 50) is 30 amps (A). Note that curve 70 in FIG. 2 illustrates the current, Iout, over time as the variable clamp is increased in voltage. Also illustrated in FIG. 2 is curve 80 which represents the BEMF voltage of motor 12. In this example, it is assumed that at time=0, the BEMF voltage is at its maximum value (11 volts, in this example).

At time=1 millisecond (ms), the transition to inactive mode begins. At this time, power transistor 48 is switched off by coupling the gate of power transistor 48 to the source of power transistor 48 via resistive element 46, as was described above. At this point, turn-off control circuitry 18 turns transistor 30 on for 1 ms while maintaining transistors 28 and 26 off, as illustrated by signals 84, 86, and 88 of FIG. 2. That is, turn-off control circuitry 18 may output each of signals 84, 86, and 88 (whose magnitude may be based on Vbat) to transistors 30, 28, and 26, respectively. Any circuit design, as known in the art, may be used to implement the functionality of turn-off control circuitry 18 in generating signals 84, 86, and 88.

When transistor 30 is on, the value of the variable clamp becomes 10 volts, such that the drain to source voltage of power transistor 48 is clamped to 10 volts. Therefore, Vout (the voltage at OUT 50) decreases and is clamped at 4 volts. Note that when the drain to source voltage of power transistor 48 is initially clamped to 10 volts, the peak power (which is "current times voltage") is "30 A×10V" which is 300 watts. Also, current Iout begins to decrease. After another 1 ms (at time=2 ms), turn-off control circuitry 18 turns on transistor 28 and turns off transistors 26 and 30. Therefore, the value of the variable clamp is stepped up by 5 volts (the voltage drop across a zener diode) to 15 volts. Therefore, Vout continues to decrease and is clamped at −1 volts. The current Iout also continues to decrease at an increasing rate as compared to when transistor 30 was on. After another 1 ms (at time=3 ms), turn-off control circuitry 18 turns on transistor 30 and turns off transistors 26 and 28. Therefore, the value of the variable clamp is further stepped up by 5 volts to 20 volts. The current Iout also continues to decrease at an increasing rate. Therefore, Vout should be prevented, by clamp 24, from falling below −6 volts. However, note that negative clamp 14 clamps Vout at −5 volts, as was described above. Therefore, Vout does not reach the −6 volts, but instead, at some time between 3 and 4 ms, Vout is clamped at −5 volts. At this point, the current Iout reaches 0 Amps and power transistor 48 has been completely transitioned to off (and the transition from active mode to inactive mode has been completed). However, note that a BEMF voltage is still present in motor 12, therefore, the voltage at OUT 50 (Vout) becomes the level of the BEMF voltage, which then continues to decrease as the motor continues to decrease in speed. Note that now that all of transistors 26, 28, and 30 are off, clamp 24 provides its full clamp value of 35 volts.

Note that, in one embodiment, the initial value of clamp 24 when circuit 10 is transitioned from active to inactive mode is 10 volts, such that OUT 50 is clamped to "Vbat minus 10 volts." Most of the time, when circuit 10 is transitioned from active to inactive mode, BEMF will be at its maximum value. Therefore, in the example of FIG. 2 in which the maximum BEMF is 11 volts and Vbat is 14 volts, the initial clamp value of 10 volts ensures that Vout (the voltage of OUT 50) falls below the value of BEMF. In this manner, coil 64 can effectively be discharged. Therefore, in one embodiment, the initial clamp value (and subsequent discrete clamp values) of clamp 24 when transition from active to inactive mode may be designed to ensure that coil 64 can effectively be discharged (such as, for example, by ensuring that the voltage at OUT 50 will be less than the BEMF voltage). In one embodiment, the initial clamp value upon transition to inactive mode can be selected to ensure that the voltage of OUT 50 is still less than BEMF. In the case in which the BEMF voltage is not greater than the voltage of OUT 50 (such as the worst case scenario, in which the BEMF voltage is zero), note that coil 64 will simply take even longer to discharge since the voltage at OUT 50 will not fall below the BEMF voltage until the subsequent time interval (t=2 ms, in the example of FIG. 2).

By using variable clamp 24 to step up the clamp value over time during the transition of active mode to inactive mode, the peak power during the transition is limited as compared to a clamp which initially begins with a higher value. For example, as described in reference to FIG. 2, with the initial clamp value of clamp 24 being 10 V, and assuming a current of 30 A and a Vbat of 14 V, the peak power reaches 300 Watts. However, if, upon transitioning from active mode to inactive mode, a fixed clamp value of, for example, 35 volts were used rather than a variable clamp, the voltage at OUT 50 would drop to −5 V (as clamped by negative clamp 14). Therefore, the voltage drop at OUT 50 from Vbat of 14V to −5 V would be 19 V. In this case, the peak power upon transitioning would instead be "30 A times 19 V" which is 570 W. This is nearly double the 300 W peak power achievable with the use of a variable clamp such as variable clamp 24. Note that, with the use of variable clamp 24 which increases the value of the clamp at predetermined intervals of time, the overall time required to turn off transistor 48 and thus transition from active to inactive mode may be longer than using an initial drop of OUT 50 to −5 V; however, this increase in time may be acceptable in exchange for the reduction in peak power that may be achieved.

In alternate embodiments, different configurations of variable clamp 24 may be used. For example, the discrete voltage values of the clamp may be different from the example above of 10V, 15V, and 20V. The clamp values may be increased at a different rate, and the predetermined time intervals may be larger or smaller than 1 ms. Furthermore, the variable clamp values and/or the predetermined time intervals may be programmable such that they can be adjusted as needed with respect to the particular circuit or application. For example, if a different load were to be rather than DC motor 12, the variable clamp could be adjusted accordingly.

By now it should be appreciated that there has been provided a circuit which controls the peak voltage when transitioning from an active to an inactive mode which involves turning off a power transistor. That is, in one example, through the use of a variable clamp, the drop in output voltage can be controlled as it drops such that the peak power is controlled to acceptable levels. Furthermore, in the case of the power transistor being used to drive a DC motor, the design of variable clamp 24 can be made using the BEMF of the DC motor to better improve the transition to inactive mode.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

In one embodiment, variable clamp 24, turn-off control circuit 18, and negative clamp 14 are located on a same integrated circuit and power transistor 48 is a discrete element coupled to the integrated circuit. Alternatively, other configurations may be used.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, different circuitry, other than the particular chain of zener diodes described above, can be used to provide variable clamp values. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A circuit, comprising:
   a power transistor having a first current electrode coupled to a first power supply terminal, a second current electrode as an output of the circuit, and a control electrode;
   a driver control circuit having an output coupled to the control electrode of the power transistor for controlling the power transistor during an active mode of the circuit;
   a variable clamp circuit coupled between the output of circuit and the first power supply terminal; and
   a turn-off control circuit coupled to the variable clamp circuit that selects a plurality of clamping levels of the variable clamp circuit during a transition from the active mode to an inactive mode of the circuit, wherein the plurality of clamping levels are sequentially applied at predetermined intervals of time during the transition, and wherein the power transistor is on during the active mode and off during the inactive mode.

2. The circuit of claim 1 further wherein the variable clamp circuit comprises:
   a plurality of zener diodes coupled in series and having first end coupled to the first power terminal and a second end coupled to the output of the circuit; and
   a plurality of transistors coupled to the plurality of zener diodes and the turn-off control circuit.

3. The circuit of claim 2 wherein the plurality of transistors is further characterized as comprising:
   a first transistor for shorting a first group of zener diodes of the plurality of zener diodes to provide the clamping level at a first level;
   a second transistor for shorting a second group of zener diodes of the plurality of zener diodes to provide the clamping level at a second level; and
   a third transistor for shorting a third group of zener diodes of the plurality of zener diodes to provide the clamping level at third level.

4. The circuit of claim 3, wherein the first, second, and third transistors comprise P channel transistors.

5. The circuit of claim 2, wherein the variable clamp circuit further comprises a current mirror coupled between the first power terminal and the plurality of transistors having a first signal terminal coupled to the plurality of transistors and the first end of the plurality of zener diodes and a second signal terminal coupled to the control electrode of the power transistor.

6. The circuit of claim 5 wherein the current mirror comprises bipolar transistors.

7. The circuit of claim 5 further comprising a negative voltage clamp coupled to the output of the circuit.

8. The circuit of claim 7, wherein the negative voltage clamp is coupled to a second power supply terminal and clamps the output at a level that is negative in relation to the second power supply terminal.

9. The circuit of claim 1 further comprising a negative voltage clamp coupled to the output of the circuit and to a second power supply terminal that is negative and fixed in relation to the second power supply terminal.

10. The circuit of claim 9, wherein the clamping levels are fixed in relation to the first power supply terminal.

11. A method of operating a circuit coupled to a first power supply terminal and a second power supply terminal and having an output at a source of a power transistor, comprising:
    using the power transistor to provide an output signal during an active mode of the circuit, wherein the power transistor is on during the active mode and off during an inactive mode of the circuit; and
    clamping the output at a plurality of discrete values during a transition of the circuit from the active mode to the inactive mode, wherein the discrete values of the plurality of discrete values increase in magnitude in relation to the first power terminal and descend in value in relation to the second power terminal during the transition and are sequentially applied at predetermined intervals of time during the transition.

12. The method of claim 11, wherein the clamping is further characterized by each discrete value of the plurality of discrete values is fixed in relation to the first power terminal.

13. The method of claim 12 further comprising:
    providing a negative clamp value that is fixed in value and negative in value in relation to the second power terminal, wherein the negative clamp value is functioning to clamp the output to the negative clamp value to complete the transition from the active mode to the inactive mode.

14. The method of claim 11, wherein the clamping comprises:
    providing a plurality of series-connected zener diodes between the first power supply terminal and the output; and
    shorting groups of the plurality of series-connected zener diodes during the transition from the active mode to the inactive mode.

15. The method of claim 14, wherein the shorting comprises:
    providing a plurality of transistors coupled to the groups; and
    selectively enabling transistors of the plurality of transistors during the transition from the active mode to the inactive mode.

16. The method of claim 11, comprising coupling the output to a motor.

17. A circuit, comprising:
    a power transistor having a first current electrode coupled to a first power supply terminal, a second current electrode as an output of the circuit, and a control electrode;
    a driver control circuit having an output coupled to the control electrode of the power transistor for controlling the power transistor during an active mode of the circuit;
    a plurality of series-connected zener diodes coupled between the output and the first power supply terminal;
    a plurality of transistors coupled across groups of the series-connected zener diodes; and a control circuit for selectively enabling the transistors of the plurality of transistors to selectively short the groups of the series-connected zener diodes, wherein the transistors are sequentially enabled for a predetermined amount of time during a transition from an active mode in which the power transistor is on to an inactive mode in which the power transistor is off.

18. The circuit of claim 17 further comprising:
a voltage clamp coupled to the output of the circuit and to a second power supply terminal that clamps at a value fixed in relation to the second power supply terminal.

19. The circuit of claim 17, further comprising: a current mirror coupled between the first power terminal and the plurality of series-connected zener diodes having a first signal terminal coupled to a first end of the plurality of series-connected zener diodes and a second signal terminal coupled to the control electrode of the power transistor.

20. The circuit of claim 17 further comprising a resistance coupled between the output and the control electrode of the power transistor.

* * * * *